(12) United States Patent
Wei et al.

(10) Patent No.: US 9,006,698 B2
(45) Date of Patent: Apr. 14, 2015

(54) VARIABLE RESISTANCE ELEMENT AND METHOD OF MANUFACTURING THE SAME

(75) Inventors: Zhiqiang Wei, Osaka (JP); Takeshi Takagi, Kyoto (JP); Satoru Mitani, Osaka (JP); Yoshio Kawashima, Osaka (JP); Ichirou Takahashi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 58 days.

(21) Appl. No.: 13/810,708

(22) PCT Filed: Jan. 18, 2012

(86) PCT No.: PCT/JP2012/000287
§ 371 (c)(1),
(2), (4) Date: Jan. 17, 2013

(87) PCT Pub. No.: WO2012/098879
PCT Pub. Date: Jul. 26, 2012

(65) Prior Publication Data
US 2013/0112936 A1 May 9, 2013

(30) Foreign Application Priority Data
Jan. 20, 2011 (JP) .................................. 2011-010122

(51) Int. Cl.
*H01L 47/00* (2006.01)
*H01L 21/20* (2006.01)
*H01L 45/00* (2006.01)

(52) U.S. Cl.
CPC ............ *H01L 45/1253* (2013.01); *H01L 45/08* (2013.01); *H01L 45/1233* (2013.01);
(Continued)

(58) Field of Classification Search
USPC .............................. 257/2–5, 324, 43, 536, 306
See application file for complete search history.

(56) References Cited

U.S. PATENT DOCUMENTS

| 6,995,388 B2 | 2/2006 | Hwang et al. |
| 7,208,372 B2 | 4/2007 | Hsu et al. |

(Continued)

FOREIGN PATENT DOCUMENTS

| JP | 2004-158852 | 6/2004 |
| JP | 2006-032728 | 2/2006 |

(Continued)

OTHER PUBLICATIONS

International Search Report issued Feb. 21, 2012 in International (PCT) Application No. PCT/JP2012/000287.

(Continued)

*Primary Examiner* — Julio J Maldonado
*Assistant Examiner* — Moin Rahman
(74) *Attorney, Agent, or Firm* — Wenderoth, Lind & Ponack, L.L.P.

(57) ABSTRACT

A variable resistance element including: a first electrode; a second electrode; and a variable resistance layer having a resistance value which reversibly changes according to electrical signals applied, wherein the variable resistance layer includes a first variable resistance layer comprising a first oxygen-deficient transition metal oxide, and a second variable resistance layer comprising a second transition metal oxide having a degree of oxygen deficiency lower than a degree of oxygen deficiency of the first oxygen-deficient transition metal oxide, the second electrode has a single needle-shaped part at an interface with the second variable resistance layer, and the second variable resistance layer is interposed between the first variable resistance layer and the second electrode, is in contact with the first variable resistance layer and the second electrode, and covers the single needle-shaped part.

15 Claims, 15 Drawing Sheets

(52) U.S. Cl.
CPC ......... *H01L45/1273* (2013.01); *H01L 45/146* (2013.01); *H01L 45/1625* (2013.01); *H01L 45/1675* (2013.01); *H01L 45/16* (2013.01)

(56) References Cited

U.S. PATENT DOCUMENTS

| | | | |
|---|---|---|---|
| 8,013,711 | B2 | 9/2011 | Wei et al. |
| 8,054,674 | B2 | 11/2011 | Tamai et al. |
| 8,072,795 | B1 * | 12/2011 | Wang et al. .............. 365/148 |
| 8,279,657 | B2 | 10/2012 | Takagi et al. |
| 8,309,946 | B2 | 11/2012 | Mitani et al. |
| 2004/0085833 | A1 | 5/2004 | Hwang et al. |
| 2006/0160304 | A1 | 7/2006 | Hsu et al. |
| 2007/0167008 | A1 | 7/2007 | Hsu et al. |
| 2010/0172170 | A1 | 7/2010 | Tamai et al. |
| 2010/0207094 | A1 | 8/2010 | Kanzawa et al. |
| 2010/0225438 | A1 | 9/2010 | Wei et al. |
| 2011/0031465 | A1 * | 2/2011 | Mitani et al. .............. 257/4 |
| 2011/0051500 | A1 | 3/2011 | Takagi et al. |
| 2011/0110143 | A1 * | 5/2011 | Kanzawa et al. .......... 365/148 |
| 2011/0284816 | A1 | 11/2011 | Fujii et al. |

FOREIGN PATENT DOCUMENTS

| | | |
|---|---|---|
| JP | 2006-203178 | 8/2006 |
| JP | 2006-344876 | 12/2006 |
| JP | 2008-198941 | 8/2008 |
| JP | 2008-306157 | 12/2008 |
| JP | 2010-027835 | 2/2010 |
| JP | 2010-245132 | 10/2010 |
| JP | 2010-287895 | 12/2010 |
| WO | 2007/102341 | 9/2007 |
| WO | 2010/064446 | 6/2010 |
| WO | 2010/086916 | 8/2010 |
| WO | 2010/087211 | 8/2010 |

OTHER PUBLICATIONS

J. McPherson et al., "Proposed Universal Relationship Between Dielectric Breakdown and Dielectric Constant", 2002 IEEE International Electron Devices Meeting, Dec. 8-11, 2002, p. 633-636.

* cited by examiner

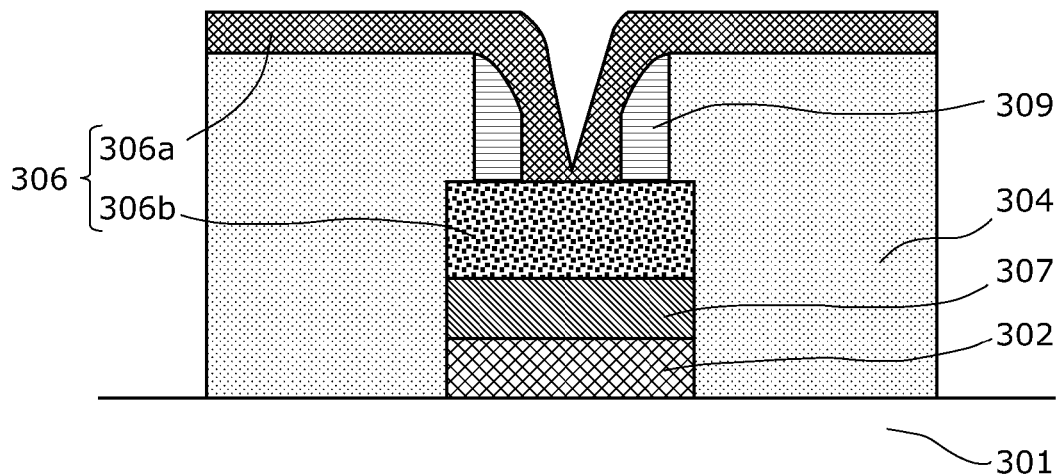
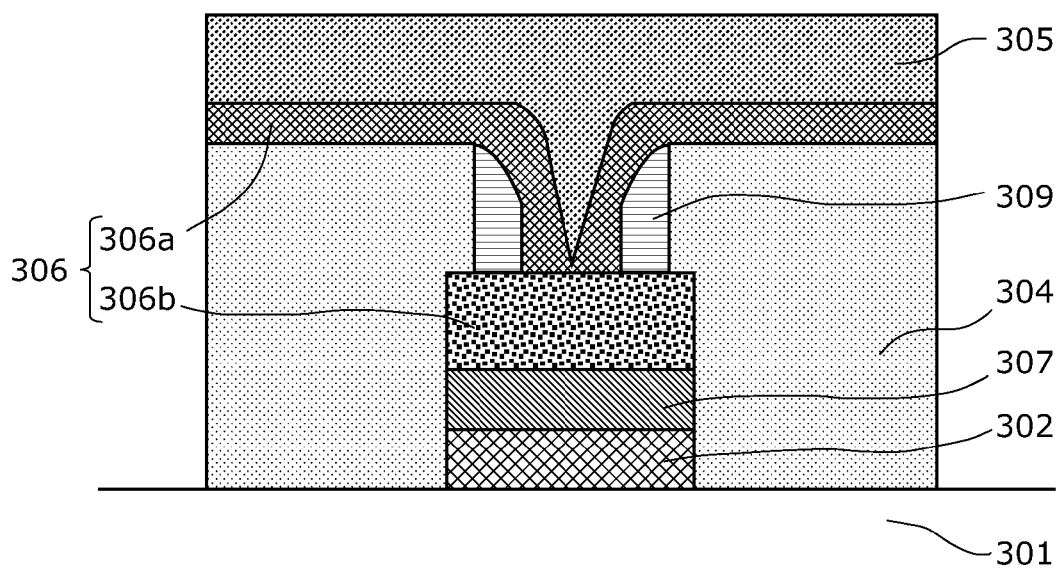

800

807
806
805

806c

VARIABLE RESISTANCE ELEMENT AND METHOD OF MANUFACTURING THE SAME

BACKGROUND OF THE INVENTION

1. Technical Field

The present invention relates to a variable resistance element, particularly to a variable resistance element having a resistance value which reversibly changes according to applied electrical signals.

2. Background Art

In recent years, along with the development of digital technology in electronic devices, there has been an increasing demand for nonvolatile memory devices having a large capacity for storing data such as music, image, or information. As a solution to meet such demand, attention is being focused on a nonvolatile memory device (hereinafter referred to as a ReRAM) which uses a variable resistance element in a memory cell, the variable resistance element having a resistance value which changes according to applied electrical signals, and the state of the resistance element being retained by the variable resistance element. This is because ReRAM has characteristics that the configuration of the variable resistance element is relatively simple and thus can be highly integrated easily, and the compatibility with the conventional semiconductor process can be effortlessly achieved.

As examples, Japanese Unexamined Patent Application Publication No. 2008-306157, Japanese Unexamined Patent Application Publication No. 2006-203178, and WO 2010/086916 each disclose a variable resistance element including two electrodes and a variable resistance layer interposed between the electrodes, the resistance state of the variable resistance layer being reversibly changeable. FIGS. 8, 9, and 10 are cross-sectional views illustrating the configurations of conventional variable resistance elements which are disclosed in the aforementioned Japanese Unexamined Patent Application Publication No. 2008-306157, Japanese Unexamined Patent Application Publication No. 2006-203178, and WO 2010/086916, respectively.

FIG. 8 illustrates the configuration of a conventional variable resistance element 800 described in Japanese Unexamined Patent Application Publication No. 2008-306157. The variable resistance element 800 has a basic structure (the upper illustration in FIG. 8) in which a variable resistance layer 806 including a metal oxide layer is interposed between a first electrode 807 and a second electrode 805. By applying a predetermined voltage across the first electrode 807 and the second electrode 805 of the variable resistance element 800 with the basic structure, a filament 806c (the lower illustration in FIG. 8) is formed as a current path (a region where the density of a current which flows across the electrodes locally increases) between the first electrode 807 and the second electrode 805. Hereinafter, the process of forming the filament 806c for the first time is referred to as an initial breakdown, and a voltage necessary for causing the initial breakdown is referred to as an initial breakdown voltage.

FIG. 9 illustrates the configuration of a conventional variable resistance element 900 described in Japanese Unexamined Patent Application Publication No. 2006-203178. The variable resistance element 900 includes a second electrode 905 having nano-needles 905a. The variable resistance layer 906 is adjacent to the nano needles 905a. The first electrode 907 is adjacent to the variable resistance layer 906. Because only the second electrode 905 is provided with the nano needles 905a which are conductive, the variable resistance element 900 has an asymmetric electrode structure. The number of nano-needles which extend on one square micron area on the surface of the second electrode 905 normally exceeds 100.

Normally, the higher the density of the nano-needles 905a, the greater the difference between the resistance values of the variable resistance layer 906 in a high resistance state and a low resistance state, each resistance value being changeable according to an applied constant voltage pulse. The performance characteristics of the variable resistance element 900 are improved by a nonuniform electric field generated by the nano-needles 905a. The electric field at the tip of the nano needles 905a is much higher than the overall average electric field. Therefore, the resistance value of the variable resistance layer 906 can be changed using a weak electrical pulse having a low voltage.

FIG. 10 illustrates the configuration of a conventional variable resistance element 1000 described in WO 2010/086916. The variable resistance element 1000 includes a substrate 1001, an oxide layer 1002 formed on the substrate 1001, a first electrode 1007 formed on the oxide layer 1002, a second electrode 1005 having a plurality of needles 1005a, and a variable resistance layer 1006 interposed between the first electrode 1007 and the second electrode 1005. Here, the variable resistance layer 1006 comprises an oxygen-deficient oxide, and includes a first metal oxide containing layer (hereinafter referred to as a "first metal oxide layer") 1006b having a high degree of oxygen deficiency, and a second metal oxide containing layer (hereinafter referred to as a "second metal oxide layer") 1006a having a low degree of oxygen deficiency, which is formed on the first metal oxide layer 1006b.

The thickness t of the second metal oxide layer 1006a is greater than the height h of each of the needles 1005a. Thus, the distance between the tip of each of the needles 1005a and the first metal oxide layer 1006b is t−h and is smaller than t which is the distance between the portion of the second electrode 1005 where no needle 1005a is present and the first metal oxide layer 1006b. A plurality of needles 1005a is formed by heating the second electrode 1005. Because the electric field is concentrated on the vicinity of the tips of the needles 1005a due to the formation of the plurality of needles 1005a, a filament region, in which a resistance change phenomenon occurs, is more likely to be formed.

However, with any of the configurations of Japanese Unexamined Patent Application Publication No. 2008-306157, Japanese Unexamined Patent Application Publication No. 2006-203178, and WO 2010/086916, a filament region in which a resistance change phenomenon occurs, and the needles that define the location of the filament region are formed at random in a plane parallel to the substrate of the electrodes. In addition, the composition of the metal oxide comprised by the variable resistance layer is not uniform in a plane parallel to the substrate. Specifically, the vicinity of the side wall of the variable resistance element tends to have an adverse effect such as etching damage or oxidation in a process of forming an interlayer insulating layer more severely than the central portion of the variable resistance element has. Therefore, the central portion and the vicinity of the side wall of the variable resistance element have different amounts of oxygen in the metal oxide.

Thus, the characteristics of a variable resistance element, particularly the initial breakdown voltage and the resistance value of the variable resistance element in operation vary depending on whether a filament region is generated in the central portion of the variable resistance element or the side wall of the variable resistance element, thereby causing a problem that the performance characteristics of the plurality of variable resistance elements vary. Such a variation in the performance characteristics impairs the stability and reliability of the operation of a semiconductor memory device which uses a variable resistance element. As a solution to cope with such a variation, an additional dimension needs to be added to the design size of the variable resistance element, and consequently miniaturization and increase in capacity of a storage device are prevented.

SUMMARY OF THE INVENTION

The present invention has been made in view of such a problem, and it is an object of the invention to provide a variable resistance element and a method of manufacturing the variable resistance element, the variable resistance element being capable of reducing a variation in the initial breakdown voltage and the resistance value of the variable resistance element in operation.

In order to solve the existing problem, one aspect of the present invention provides a variable resistance element including: a first electrode; a second electrode; and a variable resistance layer interposed between the first electrode and the second electrode and in contact with the first electrode and the second electrode, the variable resistance layer having a resistance value which reversibly changes according to electrical signals applied between the first electrode and the second electrode, wherein the variable resistance layer is formed by stacking a first variable resistance layer comprising a first oxygen-deficient transition metal oxide, and a second variable resistance layer comprising a second transition metal oxide having a degree of oxygen deficiency lower than a degree of oxygen deficiency of the first transition metal oxide, the second electrode has a single needle-shaped part protruding toward the second variable resistance layer, the second variable resistance layer is interposed between the first variable resistance layer and the second electrode, is in contact with the first variable resistance layer and the second electrode, and covers the needle-shaped part of the second electrode, and a height of the needle-shaped part of the second electrode is greater than a thickness of a portion of the second variable resistance layer, where the needle-shaped part has not entered.

The present invention can be implemented not only as such a variable resistance element but also as a method of manufacturing the variable resistance element.

In the variable resistance element according to the present invention, a needle-shaped part is formed at a controlled location in the electrode, so that the location of a filament region in which a resistance change phenomenon occurs is controlled by intentionally generating a concentrated electric field. Thus, a variation in the initial breakdown voltage and the resistance value of the variable resistance element in operation can be reduced. Consequently, it is possible to reduce an additional dimension needed to be added to the design size of the variable resistance element as a solution to cope with the aforementioned variation, and thus a finer structure and a larger capacity of a storage device can be achieved.

BRIEF DESCRIPTION OF THE DRAWINGS

FIG. 4G is a cross-sectional view illustrating the method of manufacturing the main part of the variable resistance element according to Embodiment 2 of the present invention.

FIG. 4H is a cross-sectional view illustrating the method of manufacturing the main part of the variable resistance element according to Embodiment 2 of the present invention.

DETAILED DESCRIPTION OF THE EMBODIMENTS

Figure 1:
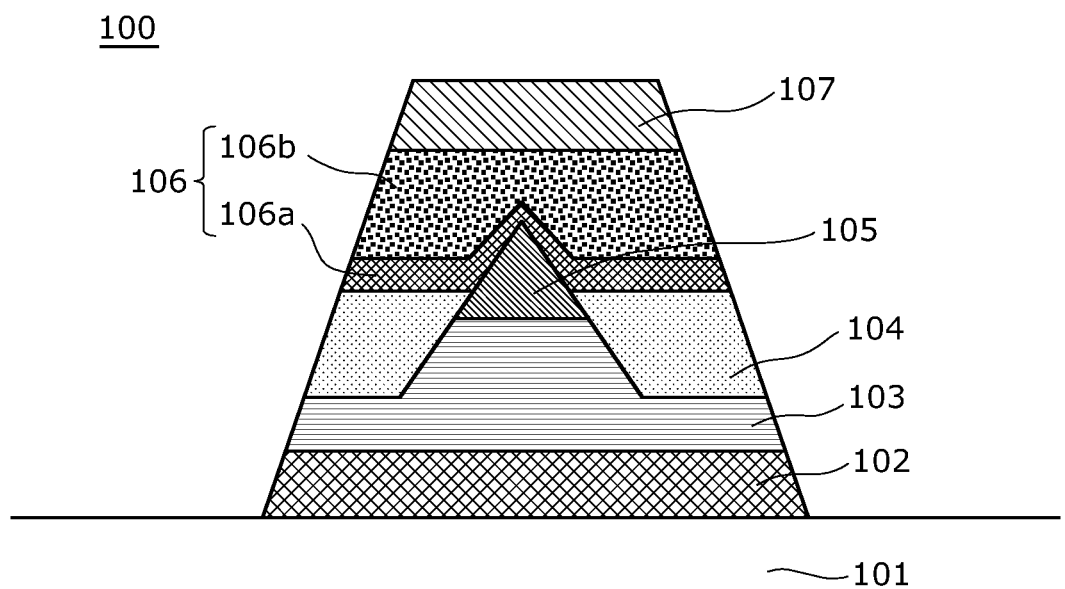
FIG. 1 is a cross-sectional view of a variable resistance element according to Embodiment 1 of the present invention.

An aspect of the present invention provides a variable resistance element including: a first electrode; a second electrode; and a variable resistance layer interposed between the first electrode and the second electrode and in contact with the first electrode and the second electrode, the variable resistance layer having a resistance value which reversibly changes according to electrical signals applied between the first electrode and the second electrode, wherein the variable resistance layer is formed by stacking a first variable resistance layer comprising a first oxygen-deficient transition metal oxide, and a second variable resistance layer comprising a second transition metal oxide having a degree of oxygen deficiency lower than a degree of oxygen deficiency of the first transition metal oxide, the second electrode has a single needle-shaped part protruding toward the second variable resistance layer, the second variable resistance layer is interposed between the first variable resistance layer and the second electrode, is in contact with the first variable resistance layer and the second electrode, and covers the needle-shaped part of the second electrode.

The height of the needle-shaped part of the second electrode may be greater than the thickness of the portion of the second variable resistance layer where the needle-shaped part has not entered.

The first variable resistance layer may have a recess at the location where the needle-shaped part has entered.

The second variable resistance layer may have a protrusion at the location where the needle-shaped part enters, and is connected to the first variable resistance layer only at the protrusion. The variable resistance element may further include a spacer which is interposed between the first variable resistance layer and the second variable resistance layer, and which covers the side surface of the protrusion of the second variable resistance layer.

With the above configuration, the location of the needle-shaped part can be intentionally controlled, and the electric field is concentrated only on the vicinity of the tip of the single needle-shaped part of the second electrode, and thus a filament region in which a resistance change phenomenon occurs can be controlled. Consequently, a variation in the initial breakdown voltage and the resistance value of the variable resistance element in operation can be reduced. By reducing the variation, it is possible to reduce an additional dimension needed to be added to the design size of the variable resistance element as a solution to cope with the aforementioned variation, and thus a finer structure and a larger capacity of a storage device can be achieved. The electric field is concentrated on the second variable resistance layer which is in contact with the single needle-shaped part of the second electrode having a low degree of oxygen deficiency, thereby allowing a low voltage operation.

Particularly, with a configuration in which a spacer is provided between the first variable resistance layer and the second variable resistance layer, the contact area therebetween can be reduced, and thus a leak current of the variable resistance element can be reduced.

In the above-described variable resistance element, the second electrode, the second variable resistance layer, the first variable resistance layer, and the first electrode may be stacked in this order on a semiconductor substrate.

With the above configuration, the needle-shaped part of the second electrode is formed by etching, and thus the shape of the needle-shaped part can be easily controlled.

In the above-described variable resistance element, the first electrode, the first variable resistance layer, the second variable resistance layer, and the second electrode may be stacked in this order on a semiconductor substrate.

With the above configuration, the needle-shaped part of the second electrode is formed in a self-aligned manner, and thus the process of etching precious metal used as an electrode material can be omitted, and the manufacturing cost can be reduced.

In the above-described variable resistance element, each of the first metal oxide and second metal oxide may comprise one of tantalum (Ta), hafnium (Hf), zirconium (Zr), titanium (Ti), niobium (Nb), tungsten (W), nickel (Ni), and iron (Fe).

These materials are preferred for use in a variable resistance layer and exhibit favorable performance characteristics of the variable resistance element (excellent retention characteristics and high-speed operation), however, an initial breakdown is needed to cause the variable resistance element to change from an initial state to a state which allows a resistance change phenomenon. Because the initial breakdown characteristics are significantly stabilized by the effect of the present invention, favorable performance characteristics of the variable resistance element can be obtained by using one of the above-mentioned materials for the variable resistance layer.

The present invention can be implemented not only as such a variable resistance element but also as a method of manufacturing the variable resistance element.

Before the details of the present invention are described, hereinafter, the experimental result obtained by the inventors and the cause of variation will be described below, the result indicating that a plurality of conventional variable resistance elements have a variation in the initial breakdown voltages and resistance values of the variable resistance elements in operation.

Figure 5:
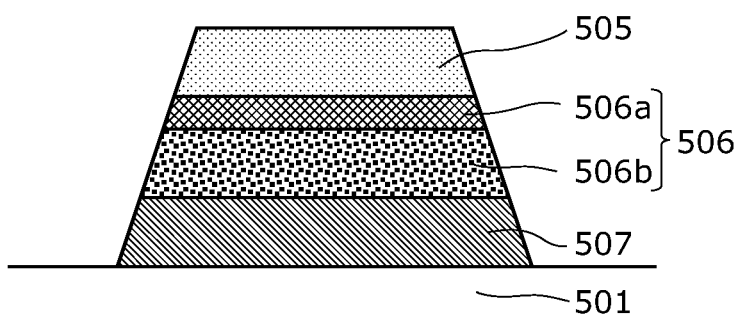
FIG. 5 is a cross-sectional view of a typical nonvolatile variable resistance element.

FIG. 5 illustrates a cross-sectional view of a variable resistance element 500 which was fabricated in the experiment. The variable resistance element 500 is formed by stacking a first electrode 507, a variable resistance layer 506, and a second electrode 505 on a substrate 501. Referring to FIG. 5, the variable resistance layer 506 interposed between the first electrode 507 and the second electrode 505 includes a first transition metal oxide layer 506b comprising an oxygen-deficient transition metal oxide and a second transition metal oxide layer 506a comprising an oxygen-deficient transition metal oxide having a degree of oxygen deficiency lower than that of the oxygen-deficient transition metal oxide in the first transition metal oxide layer 506b.

The degree of oxygen deficiency indicates a ratio of the number of deficient oxygen atoms in a transition metal with respect to the number of oxygen atoms included in an oxide having a stoichiometric composition. Normally, an oxide having a stoichiometric composition often exhibits insulating characteristics, and an oxygen-deficient transition metal oxide often exhibits semiconductor characteristics. That is to say, the second transition metal oxide layer 506a preferably has a degree of oxygen deficiency and a resistance which are respectively lower and higher than the degree of oxygen deficiency and the resistance of the first transition metal oxide layer 506b.

By adopting such a configuration, the voltage applied between the first electrode 507 and the second electrode 505 at the time of a variable change is largely distributed to the second transition metal oxide layer 506a so as to induce an oxidation-reduction reaction in the second transition metal oxide layer 506a.

Here, the same material may be used or different materials may be used for the first transition metal comprised in the first transition metal oxide layer 506b and the second transition metal comprised in the second transition metal oxide layer 506a. A transition metal which may be used includes tantalum (Ta), titanium (Ti), hafnium (Hf), zirconium (Zr), niobium (Nb), and tungsten (W).

Because a transition metal can assume a plurality of oxidation states, a different resistance state may be achieved by an oxidation reduction reaction. When different materials are used for the first transition metal and the second transition metal, the standard electrode potential of the second transition metal is preferably lower than the standard electrode potential of the first transition metal. This is because the resistance change phenomenon is probably caused in the following manner: an oxidation reduction reaction occurs in a fine filament formed in the second transition metal oxide layer 506a having a high resistance so as to change the resistance value of the filament.

The dielectric constant of the second transition metal oxide is preferably higher than the dielectric constant of the first transition metal oxide. Otherwise, the band gap of the second transition metal oxide is preferably smaller than the band gap of the first transition metal oxide. By using the first transition metal oxide and the second transition metal oxide which satisfy one or both of the above-mentioned conditions, the electric field strength necessary to cause dielectric breakdown of the second transition metal oxide layer 506a is lower than the electric field strength necessary to cause dielectric breakdown of the first transition metal oxide layer 506b, and thus the initial breakdown voltage can be reduced.

This is because, a correlation is observed between the dielectric breakdown electric field strength (Breakdown Strength) and the dielectric constant of an oxide layer, the correlation indicating that the dielectric breakdown electric field strength decreases as the dielectric constant increases as illustrated in FIG. 1 and p. 633-636 of "J. McPherson et al., IEDM 2002". In addition, as illustrated in FIG. 2 and p. 633-636 of "J. McPherson et al., IEDM 2002" a correlation is observed between the dielectric breakdown electric field strength and the band gap of an oxide layer, the correlation indicating that the dielectric breakdown electric field strength increases as the band gap increases.

A plurality of the variable resistance elements 500 were fabricated at the same time by a method in which a thin-film stacked structure including the first electrode 507, the variable resistance layer 506, and the second electrode 505 is formed on the substrate 501, and patterned. An interlayer insulating layer (not illustrated) was formed between adjacent variable resistance elements 500. When an interlayer insulating layer was formed, the transition metal oxide comprised in the variable resistance layer 506 was oxidized in the vicinity of the side wall of the variable resistance element 500.

Figure 6:
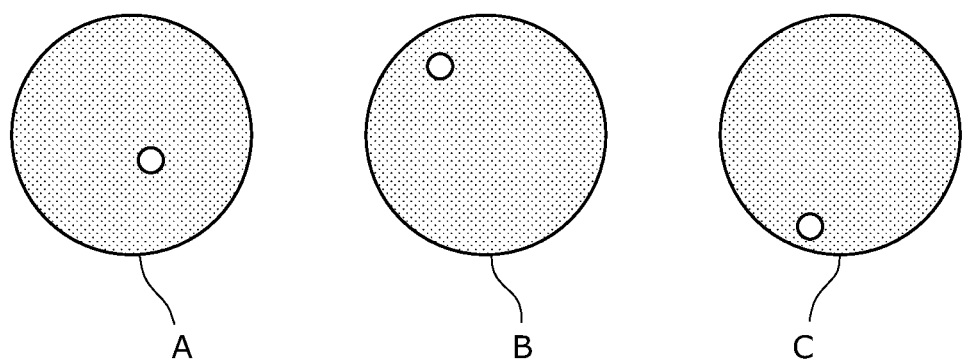
FIG. 6 is a plan view illustrating a location of a filament region generated in a typical nonvolatile variable resistance element.

FIG. 6 illustrates EBAC (Electron Beam Absorbed Current) images each showing the intensity distribution of EBAC which is measured on three variable resistance elements A, B, C which have undergone an initial breakdown and are selected from a plurality of the variable resistance elements 500 fabricated by using tantalum oxide. FIG. 6 is illustrated as a conceptual diagram.

EBAC is measured by a scanning electron microscope which is equipped with a mechanical probe. A mechanical probe, which is in contact with each of the first electrode 507 and the second electrode 505 of the variable resistance element 500, is connected to an ammeter. Primary electrons which are emitted to a sample are divided into the electrons which escape from the sample as a back scattered electron and the electrons which enter the sample. The electrons which have entered the inside of the sample are diverted to two vertical directions as absorbed currents, and flow through the ammeter via the mechanical probe. By measuring the intensity of EBAC at each of a plurality of locations in this manner, an EBAC image showing the intensity distribution of EBAC with light and dark gradations is obtained. Here, a location where a resistance is low (current is high) is set to be displayed as an EBAC image with a bright gradation, and the location of a generated filament region of the variable resistance element is identified.

The initial resistance of the variable resistance element is $10^7$ to $10^8 \Omega$, which is higher than the resistance value ($10^3$ to $10^5 \Omega$) of the variable resistance element in a normal operation of a resistance change. In a variable resistance element in an initial state, a filament region is formed by an initial breakdown, and the resistance is decreased from the resistance in the initial state, so that the variable resistance element is set in a state which allows a normal operation of a resistance change. A white region illustrated in each EBAC image in FIG. 6 is a filament region formed by the initial breakdown.

The initial breakdown is presumed to occur by a mechanism similar to the mechanism of dielectric breakdown of a $SiO_2$ thin film used as a gate oxide film of a semiconductor. In a gate oxide film of a semiconductor, when the $SiO_2$ thin film is subjected to a voltage or current stress, bonding between atoms is released and a defect occurs. A leak current then occurs via the defect as a transfer point, and when the number of defects increases, a leak path is formed, that is to say, a filament is formed, thereby causing a dielectric breakdown.

In the variable resistance element 500, the second transition metal oxide layer 506a having a low degree of oxygen deficiency has a slightly less number of oxygen atoms than the second transition metal oxide having a stoichiometric composition, which is an insulating material. Thus, it is probable that a certain degree of defect originally exists in the variable resistance element 500, and a dielectric breakdown phenomenon similar to that of $SiO_2$ occurs.

Referring to FIG. 6, it can seen that the distance between the location of a filament region formed and the edge of the variable resistance element is decreasing in the order of the variable resistance elements A, B, C.

Figure 7A:
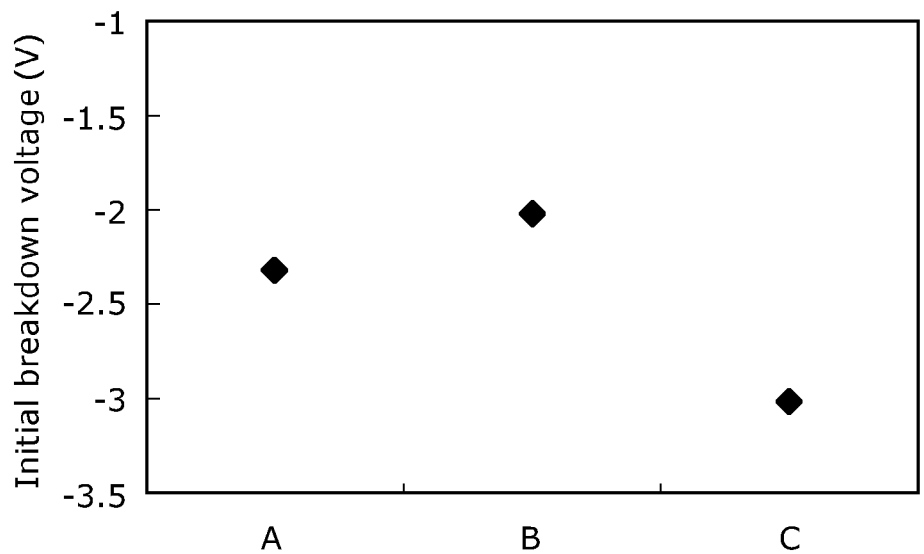
FIG. 7A is a graph illustrating a variation in the initial breakdown voltage of a typical nonvolatile variable resistance element, the variation being in relation to the location of a filament region generated.

FIG. 7A is a graph which plots the initial breakdown voltages of the variable resistance elements A, B, C illustrated in FIG. 6. It can be seen that the absolute value of the initial breakdown voltage of the variable resistance element C, in which a filament region formed is nearest to the edge, is the greatest. The initial break voltages of the variable resistance elements A, B also have a difference.

Figure 7B:
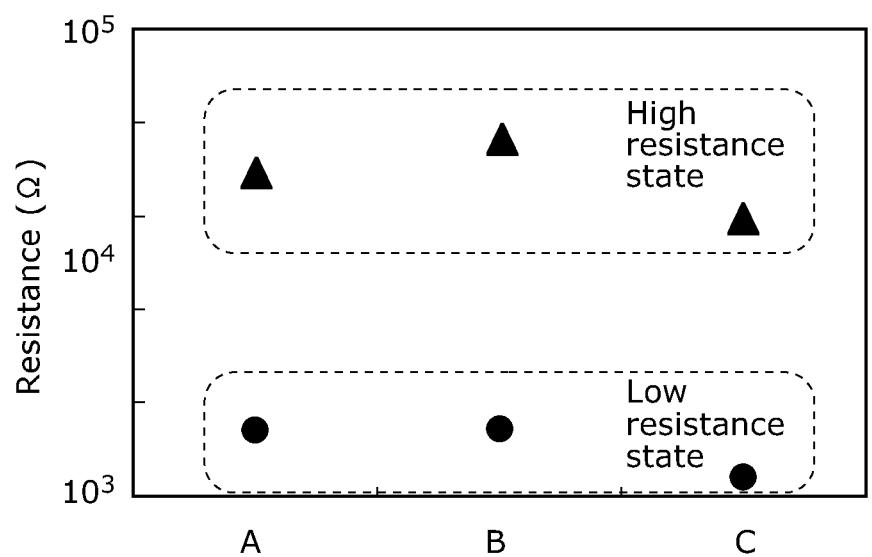
FIG. 7B is a graph illustrating a variation in the resistance values of a typical nonvolatile variable resistance element in a high resistance state and a low resistance state which are assumed by the nonvolatile variable resistance element in operation, the variation being in relation to the location of a filament region generated.
Figure 8:
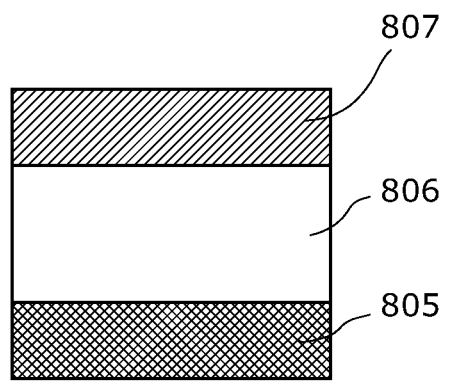
FIG. 8 is a cross-sectional view of a variable resistance element according to a conventional embodiment.
Figure 8:
Figure 8:
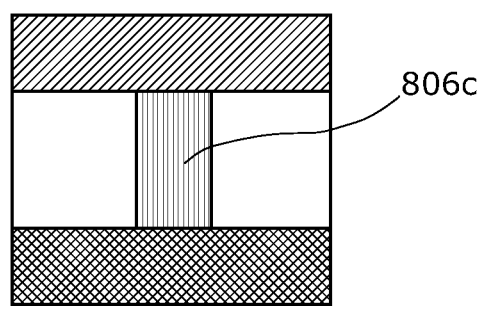
Figure 9:
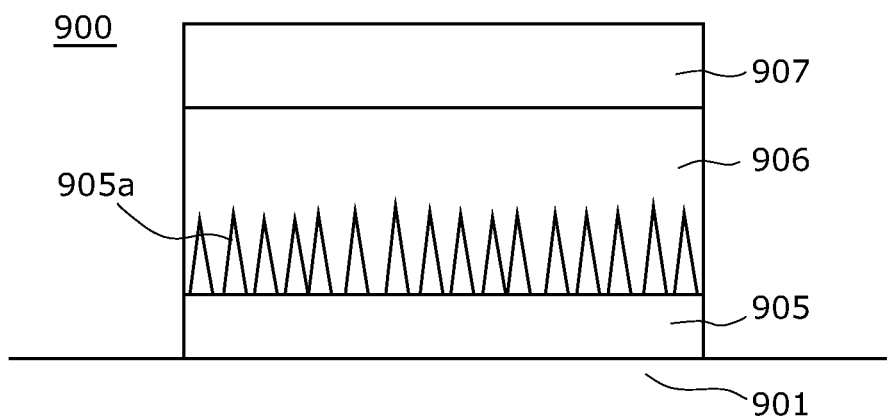
FIG. 9 is a cross-sectional view of a variable resistance element according to a conventional embodiment.
Figure 10:
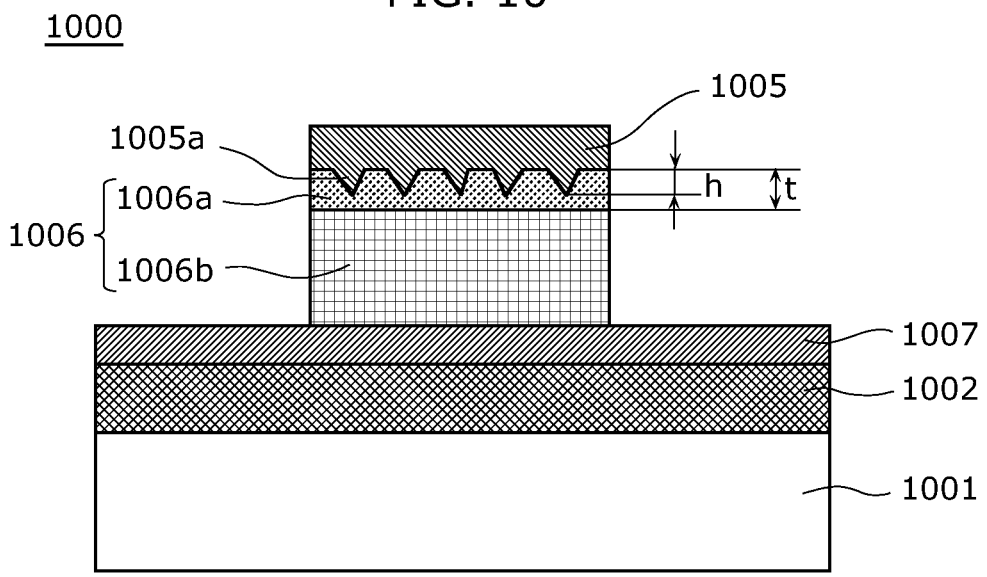
FIG. 10 is a cross-sectional view of a variable resistance element according to a conventional embodiment.

FIG. 7B is a graph which plots the resistance values in a high resistance state and in a low resistance state when the variable resistance elements A, B, C illustrated in FIG. 6 change their resistances after an initial breakdown. It can be seen that a variable resistance element having a higher absolute value of the initial breakdown voltage has lower resistance values both in a high resistance state and in a low resistance state, and thus the resistance value varies by the location of the filament formed.

From the above experimental result, it can be concluded that a variation between the elements can be reduced by having uniform relative locations of the filament regions formed in the variable resistance layers 506 of a plurality of variable resistance elements. The location of a filament region formed is preferably near the center of each variable resistance element. As a result of reduced variation, it is possible to reduce an additional dimension needed to be added to the design size of the variable resistance element as a solution to cope with the aforementioned variation, and thus a nonvolatile memory having a large capacity can be easily implemented.

Hereinafter, the embodiments of the present invention will be described with reference to the drawings.

Embodiment 1

Configuration of Variable Resistance Element

FIG. 1 is a cross-sectional view illustrating a configuration example of a variable resistance element 100 according to Embodiment 1 of the present invention.

As illustrated in FIG. 1, the variable resistance element 100 includes a substrate 101, an adhesion layer 102 (having a thickness of 10 to 20 nm) which comprises titanium nitride (TiN) and is formed on the substrate 101, a truncated cone-shaped conductive layer 103 (having a thickness of 50 to 100 nm) which comprises titanium nitride aluminum (TiAlN) and is formed on adhesion layer 102, a conical (needle-shaped) second electrode 105 formed on the conductive layer 103, a second variable resistance layer 106a (having a thickness of 2 to 10 nm) which is formed on the second electrode 105 so as to cover the second electrode 105, an interlayer insulating layer 104 which is formed on the conductive layer 103 and the second electrode 105 so as to cover the area other than the conductive layer 103 and a needle-shaped part of the electrode 105, a first variable resistance layer 106b (having a thickness of 18 to 95 nm) formed on the second variable resistance layer 106a, and a first electrode 107 (having a thickness of 5 to 100 nm) which is formed on the first variable resistance layer 106b and comprises tantalum nitride (TaN).

The tip of the needle-shaped part of the second electrode 105 is provided at a location which is higher than the upper surface of the portion of the second variable resistance layer 106a where the needle-shaped part has not entered. In other words, the height of the needle-shaped part of the second electrode 105 is greater than the thickness of the portion of the second variable resistance layer 106a where the needle-shaped part has not entered. The first variable resistance layer 106b has a recess at the location where the needle-shaped part enters.

The upper surface of the interlayer insulating layer 104 is provided at a location higher than the interface between the second electrode 105 and the conductive layer 103, and the conductive layer 103 and the second variable resistance layer 106a are not directly connected to each other because of the presence of the interlayer insulating layer 104.

The second electrode 105 comprises a material such as platinum (Pt) or iridium (Ir), the material having a standard electrode potential higher than the standard electrode potential of the transition metal comprised in the second variable resistance layer 106a, and the first electrode 107. The height from the lower surface to the tip of the needle-shaped part of the second electrode 105 is in a range of 5 to 50 nm. By adopting such a configuration, an oxidation reduction reaction occurs selectively in the second variable resistance layer 106a in the vicinity of the interface between the second electrode 105 and the second variable resistance layer 106a, and thus a stable resistance change phenomenon occurs.

The variable resistance layer 106 comprises a transition metal oxide in the stacked layer structure. Constituent metal of the transition metal oxide is preferably a metal such as tantalum (Ta), hafnium (Hf), zirconium (Zr), titanium (Ti), niobium (Nb), tungsten (W), nickel (Ni), and iron (Fe). Here, an oxygen-deficient metal oxide indicates a metal oxide having an oxygen content atomic percentage which is less than the oxygen content atomic percentage of a metal oxide (normally insulating material) having a stoichiometric composition. Normally, the oxygen-deficient metal oxide often behaves like a semiconductor. By using any of the oxygen-deficient oxides of the constituent metals stated above for the variable resistance layer 106, a stable resistance change operation with better reproducibility can be achieved.

Under the assumption that the variable resistance layer 106 comprises tantalum as a transition metal, when the oxygen-deficient tantalum oxide comprised in the first variable resistance layer 106b is expressed as $TaO_x$, and the tantalum oxide comprised in the second variable resistance layer 106a is expressed as $TaO_y$, $0<x<2.5$ and $x<y$ are satisfied. In order to achieve a stable resistance change operation, $2.1 \leq y$ and $0.8 \leq x \leq 1.9$ are preferably satisfied.

A titanium oxide having a high resistance (for example, $TiO_2$) may be used for the second variable resistance layer 106a. Titanium (standard electrode potential=−1.63 eV) is a material having a standard electrode potential lower than the standard electrode potential lower of tantalum (standard electrode potential=−0.6 eV). $TiO_2$ (relative dielectric constant=95) is a material having a relative dielectric constant higher than the relative dielectric constant of $Ta_2O_5$ (relative dielectric constant=26). $TiO_2$ (band gap=3.1 eV) is a material having a band gap smaller than the band gap of $Ta_2O_5$ (band gap=4.4 eV). It is to be noted that the composition of a metal oxide layer can be measured using the Rutherford backscattering method.

Although a silicon single crystal substrate or a semiconductor substrate may be used as the substrate 101, the substrate 101 is not limited to the above substrates. A variable resistance element may be formed on a material such as a polyimide resin material.

The variable resistance element 100 can have two states: a high resistance state and a low resistance state in which the resistance value is relatively high and relatively low, respectively. When the variable resistance element 100 is driven, a voltage which satisfies predetermined conditions is applied between the second electrode 105 and the first electrode 107 from an external power source. The resistance value of the variable resistance layer 106 of the variable resistance element 100 reversibly increases or decreases according to the direction of voltage application. For example, when a pulse voltage higher than a predetermined threshold voltage is applied, the resistance value of the variable resistance layer 106 increases or decreases, whereas when a pulse voltage lower than a threshold voltage is applied, the resistance value of the variable resistance layer 106 does not change.

[Method of Manufacturing Variable Resistance Element]

Each of FIGS. 2A to 2I is a cross-sectional view illustrating a method of manufacturing the principal part of a variable resistance element 100 in Embodiment 1 of the present invention.

Figure 2A:
FIG. 2A is a cross-sectional view illustrating a method of manufacturing the main part of the variable resistance element according to Embodiment 1 of the present invention.

First, as illustrated in FIG. 2A, a titanium nitride film (having a thickness of 5 to 20 nm) which serves as the adhesion layer 102, a titanium nitride aluminum film (50 to 100 nm) which serves as the conductive layer 103, an iridium film (having a thickness of 100 to 200 nm) which serves as the second electrode 105, and a titanium nitride aluminum film (having a thickness of 200 to 400 nm) which serves as a hard mask 108 are stacked in this order on the substrate 101 to form layered films by a sputtering method.

Figure 2B:
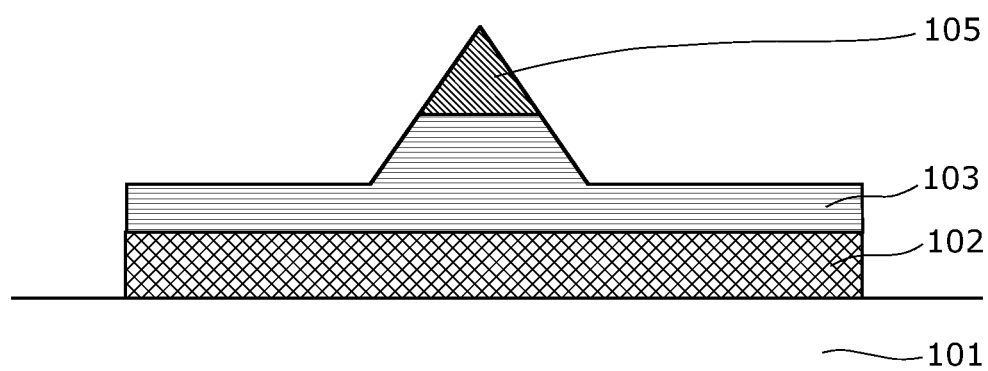
FIG. 2B is a cross-sectional view illustrating the method of manufacturing the main part of the variable resistance element according to Embodiment 1 of the present invention.

Next, as illustrated in FIG. 2B, in the process of forming the second electrode 105, the hard mask 108 is patterned by etching using a desired first mask.

In a conventional manufacturing method for forming a flat second electrode 105, upon an iridium film serving as the second electrode 105 being exposed after the hard mask 108 is etched, the etching conditions are usually changed such that the etching rate of a titanium aluminum nitride film is set to be low, and the etching rate of an iridium film is set to be high.

In contrast to this, in the manufacturing method of the present embodiment, in order to form a single needle-shaped part in the second electrode, even after the iridium film which serves as the second electrode 105 is exposed, the etching conditions are not changed and the remaining portion of the hard mask 108 and the iridium film which serves as the second electrode 105 are subsequently etched by the same etching conditions as used for the hard mask 108.

Consequently, a single needle-shaped part can be formed at substantially the center of the second electrode 105. The height from the lower surface of the second formed electrode 105 to the tip of the needle-shaped part is in a range of 5 to 50 nm. Concurrently with the above process, the conductive layer 103 is also etched to some extent to have a trapezoidal cross section (substantially truncated cone shape).

Figure 2C:
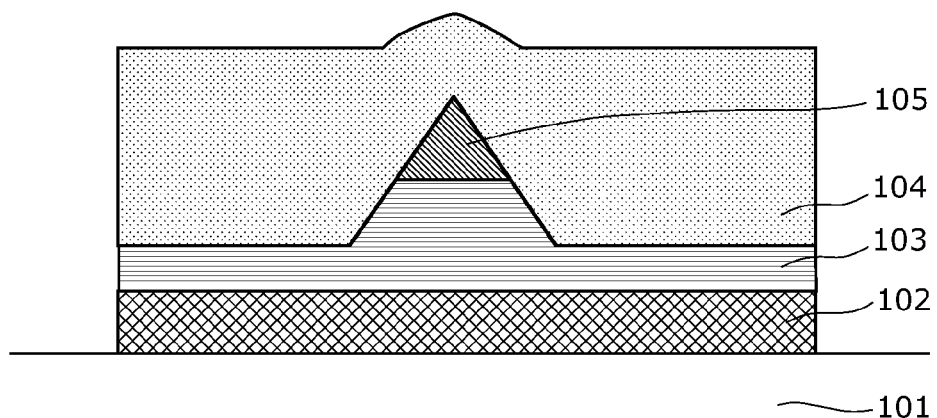
FIG. 2C is a cross-sectional view illustrating the method of manufacturing the main part of the variable resistance element according to Embodiment 1 of the present invention.
Figure 2D:
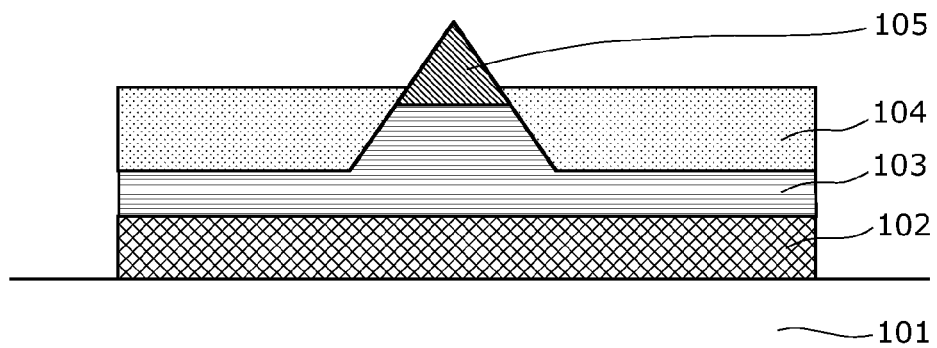
FIG. 2D is a cross-sectional view illustrating the method of manufacturing the main part of the variable resistance element according to Embodiment 1 of the present invention.

Next, as illustrated in FIGS. 2C and 2D, in the process of forming the interlayer insulating layer 104, an insulating material film which serves as the interlayer insulating layer 104 is formed to cover the second electrode 105 and the conductive layer 103, then the upper surface of the insulating material film is planarized and the second electrode 105 is exposed by etch-back. In the above process, the upper surface of the interlayer insulating layer 104 is lowered to a height which is higher than the interface between the second electrode 105 and the conductive layer 103, i.e., the lower surface of the second electrode 105. The interlayer insulating layer 104 comprises a plasma TEOS, fluoride containing oxide (for example, FSG) which is effective in reducing the parasitic capacitance between wiring lines, or a low-k material.

Figure 2E:
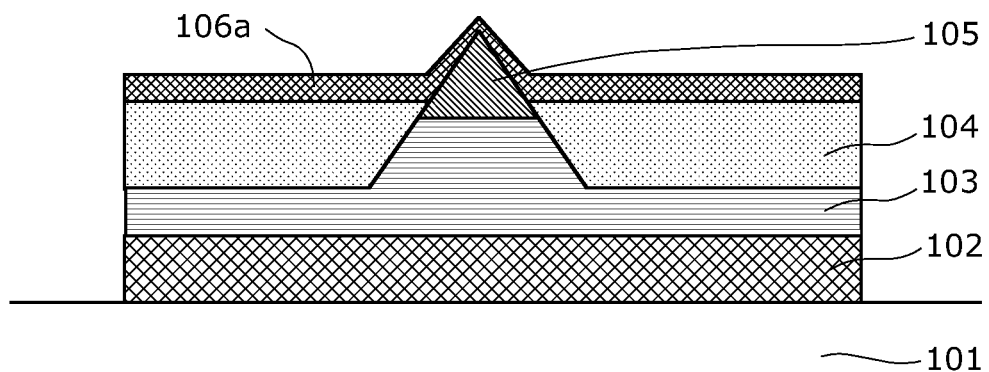
FIG. 2E is a cross-sectional view illustrating the method of manufacturing the main part of the variable resistance element according to Embodiment 1 of the present invention.

Next, as illustrated in FIG. 2E, a second tantalum oxide film which serves as the second variable resistance layer 106a is formed so as to cover the second electrode 105 and the interlayer insulating layer 104 in the process of forming the second variable resistance layer 106a. The second tantalum oxide film is formed by a reactive sputtering method in which a tantalum target is sputtered in an oxygen gas atmosphere, where the oxygen content atomic percentage, resistivity, and thickness of the second tantalum oxide film are 67 to 72 atm %, $10^7$ mΩcm or more, and 2 to 10 nm, respectively. By disposing the needle-shaped part in the second electrode 105, a portion of the second tantalum oxide film can be formed to have a thickness less than the thickness of the remaining portion of the second tantalum oxide film, the part corresponding to the tip of the needle-shaped part, and thus a locally thin film part can be stably formed.

Figure 2F:
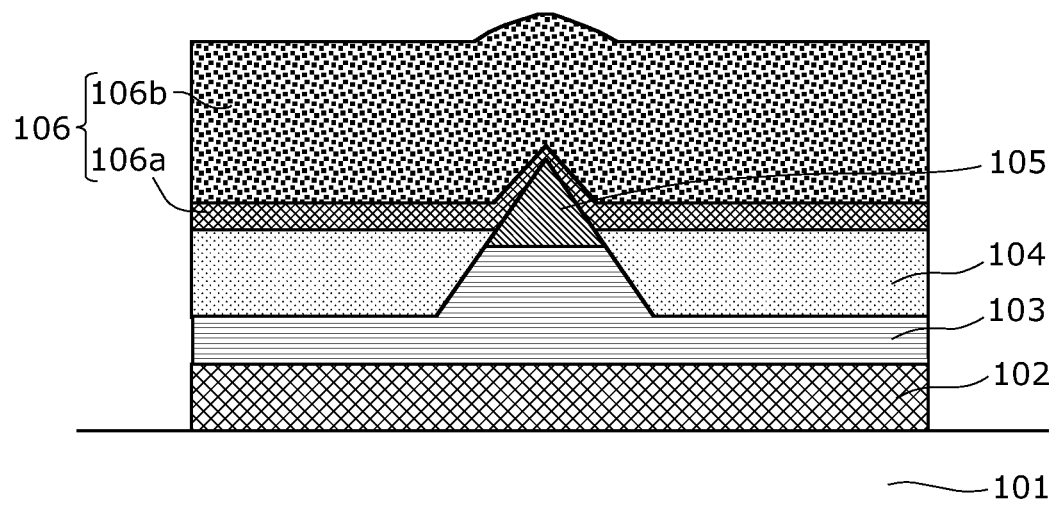
FIG. 2F is a cross-sectional view illustrating the method of manufacturing the main part of the variable resistance element according to Embodiment 1 of the present invention.
Figure 2G:
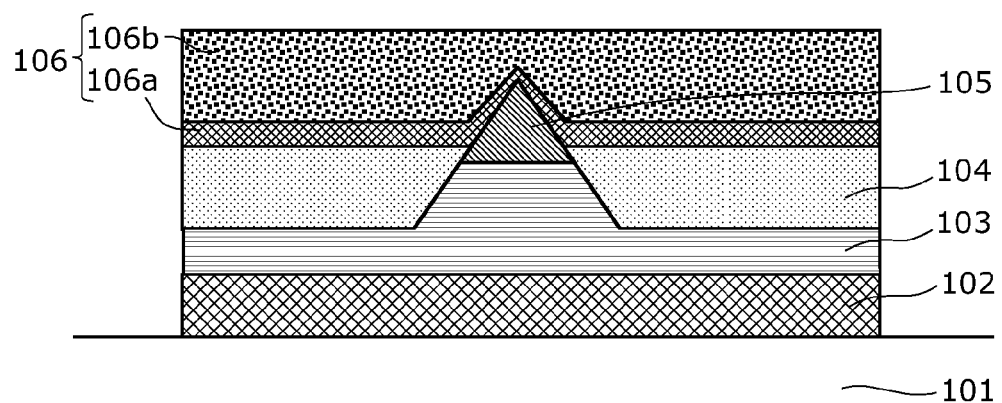
FIG. 2G is a cross-sectional view illustrating the method of manufacturing the main part of the variable resistance element according to Embodiment 1 of the present invention.

Next, as illustrated in FIGS. 2F and 2G, in the process of forming first variable resistance layer 106b, a tantalum oxide film which serves as the first variable resistance layer 106b is formed on the second variable resistance layer 106a by a so-called reactive sputtering method in which a tantalum target is sputtered in an argon and oxygen gas atmosphere. The oxygen content atomic percentage, resistivity, and thickness of the first tantalum oxide film are 50 to 65 atm %, 2 to 50 mΩcm, and 100 to 200 nm, respectively.

Next, as illustrated in FIG. 2G, the surface of the wafer is polished and planarized using a chemical mechanical polishing method (CMP method). The polishing and flattening is performed to such an extent that the convex portion illustrated in FIG. 2F is removed and the first tantalum oxide film remains on the whole surface.

By such polishing and flattening, the convex form of the needle-shaped part of the second electrode 105 is not subsequently transferred to the upper surface of the first variable resistance layer 106b, and thus significantly high flatness and continuity of the entire upper surface of the first variable resistance layer 106b is achieved.

Figure 2H:
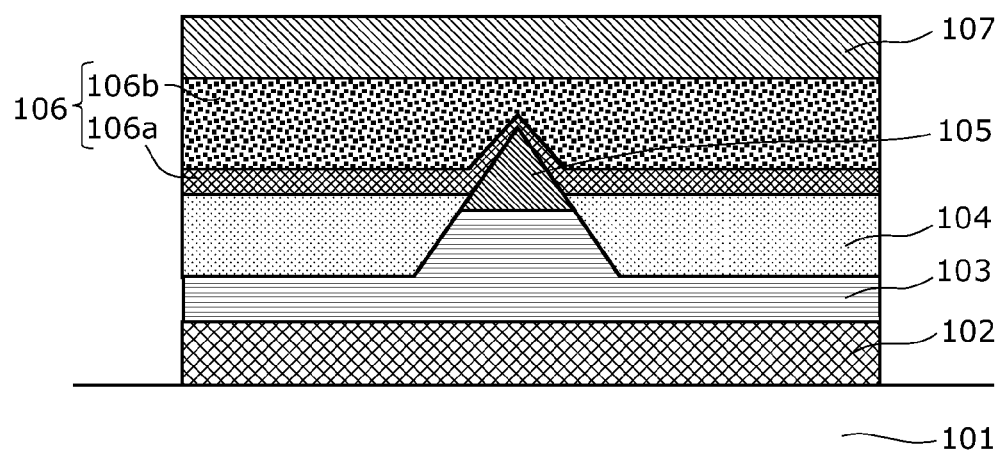
FIG. 2H is a cross-sectional view illustrating the method of manufacturing the main part of the variable resistance element according to Embodiment 1 of the present invention.
Figure 2I:
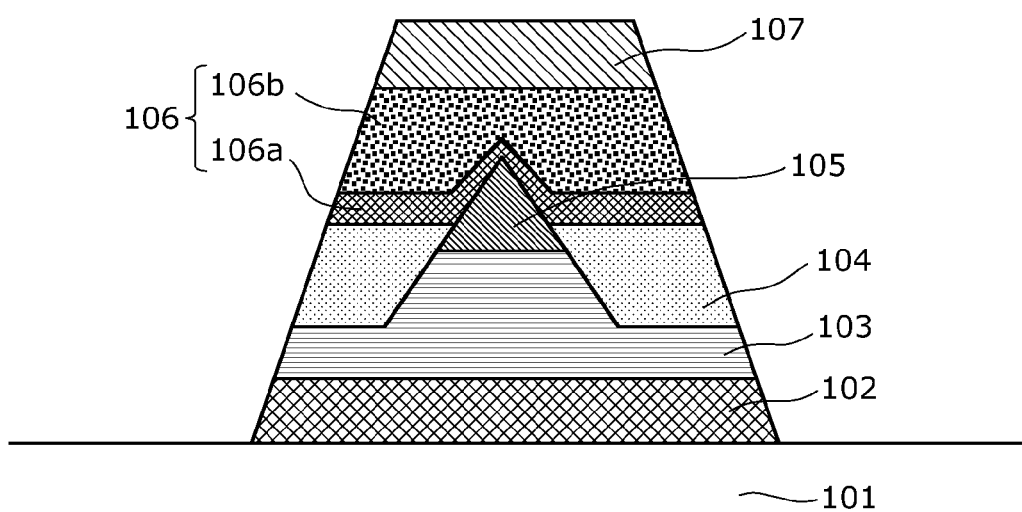
FIG. 2I is a cross-sectional view illustrating the method of manufacturing the main part of the variable resistance element according to Embodiment 1 of the present invention.

Next, as illustrated in FIGS. 2H and 2I, in the process of forming the first electrode 107, a tantalum nitride film (50 to 200 nm) which serves as the first electrode 107 is formed on the first variable resistance layer 106b by a sputtering method. Subsequently, a stacked structure including the above-mentioned layers which later serves as the first electrode 107, the variable resistance layer 106, the second electrode 105, the interlayer insulating layer 104, the conductive layer 103, and the adhesion layer 102 is patterned into a shape of a variable resistance element by etching using a desired second mask. In the present process, patterning may be performed at one time using a single second mask, or may be performed for each layer.

By the above manufacturing method, the location of the needle-shaped part can be intentionally controlled according to the positional relationship between the first mask and the second mask, and the electric field is concentrated only on the vicinity of the tip of the single needle-shaped part of the second electrode, and thus a filament region in which a resistance change phenomenon occurs can be controlled. Thus, a variation in the initial breakdown voltage and the resistance value of the variable resistance element in operation can be reduced, and therefore a finer structure and a larger capacity of a storage device can be achieved. Because the periphery of the variable resistance layer may be affected by damage at the time of etching, or oxidation at the time of formation of the interlayer insulating film, the needle-shaped part of the second electrode 105 is preferably formed at substantially the center of the variable resistance element 100.

Embodiment 2

Configuration of Variable Resistance Element

Figure 3:
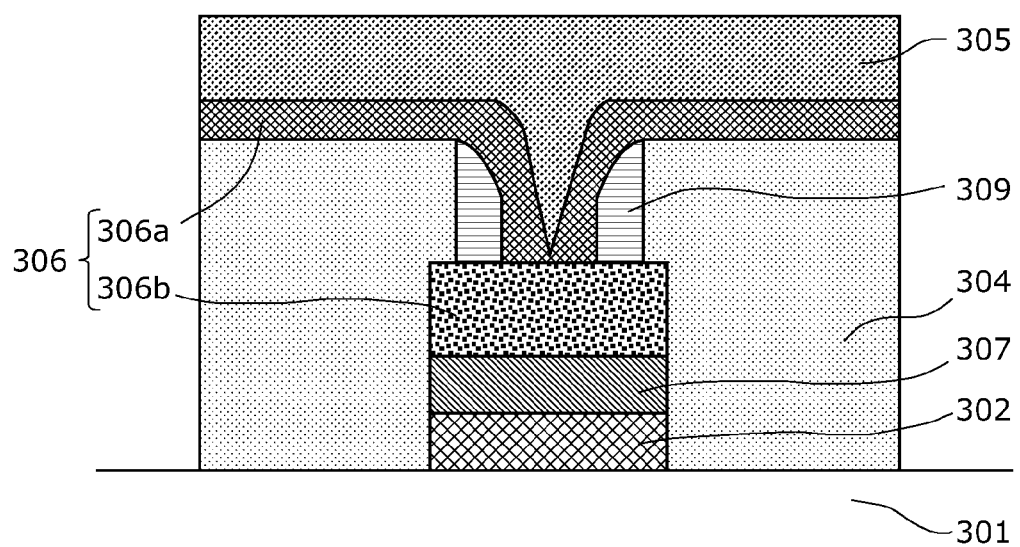
FIG. 3 is a cross-sectional view of a variable resistance element according to Embodiment 2 of the present invention.

FIG. 3 is a cross-sectional view illustrating a configuration example of a variable resistance element 300 according to Embodiment 2 of the present invention.

As illustrated in FIG. 3, the variable resistance element 300 includes a substrate 301; an adhesion layer 302 (having a thickness of 10 to 20 nm) which comprises a titanium nitride (TiN) and is formed on the substrate 301; a first electrode 307 (having a thickness of 5 to 100 nm) which comprises a tantalum nitride (TaN) and is formed on the adhesion layer 302; a first variable resistance layer 306b (having a thickness of 18 to 95 nm) formed on the first electrode 307; an interlayer insulating layer 304 which is formed on the substrate 301 and a stacked structure including the adhesion layer 302, the first electrode 307, and the first variable resistance layer 306b; a spacer 309 which is formed at the side wall of a contact hole which penetrates through the interlayer insulating layer 304 and reaches the upper surface of the first variable resistance layer 306b; a second variable resistance layer 306a which is formed on the first variable resistance layer 306b, the spacer 309, and the interlayer insulating layer 304, and covers the first variable resistance layer 306b and the spacer 309 that are exposed in the contact hole; and a second electrode 305 having a needle-shaped part which has entered a recess which is formed on the second variable resistance layer 306a and depressed in the contact hole.

In the above structure, the second variable resistance layer 306a has a downward protrusion at the location where the needle-shaped part of the second electrode 305 enters, and is connected to the first variable resistance layer 306b only at the protrusion. The spacer 309 is present between the first variable resistance layer 306b and the second variable-resistance layer 306a, and covers the side surface of the protrusion of the second variable resistance layer 306a.

The tip of the needle-shaped part of the second electrode 305 is provided at a position lower than the lower surface of the portion of the second variable resistance layer 306a where the needle-shaped part has not entered. In other words, the height of the needle-shaped part of the second electrode 305 is greater than the thickness of the portion of the second variable resistance layer 306a where the needle-shaped part has not entered.

[Method of Manufacturing Variable Resistance Element]

FIGS. 4A to 4H are each a cross-sectional view illustrating a method of manufacturing the principal part of the variable resistance element 300 in Embodiment 2 of the present invention.

Figure 4A:
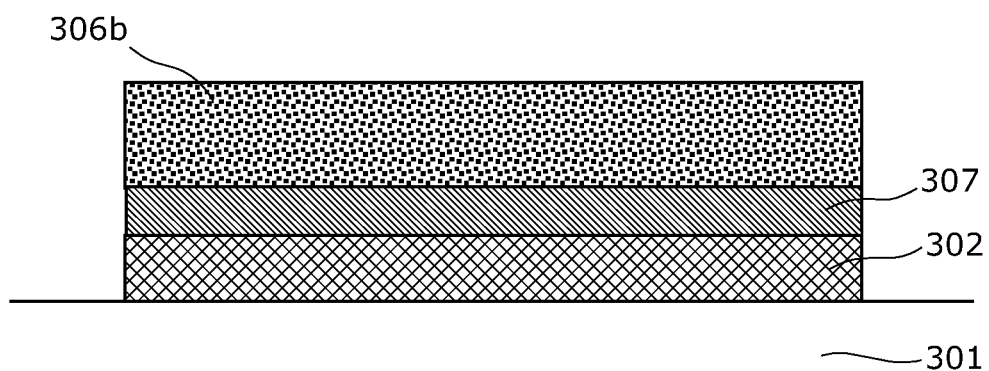
FIG. 4A is a cross-sectional view illustrating a method of manufacturing the main part of the variable resistance element according to Embodiment 2 of the present invention.
Figure 4B:
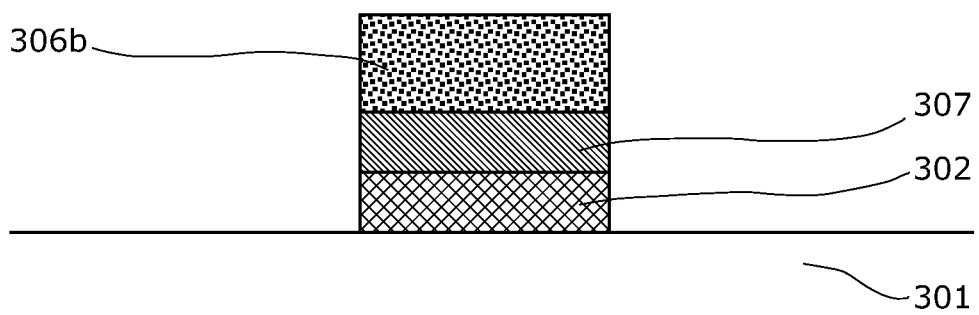
FIG. 4B is a cross-sectional view illustrating the method of manufacturing the main part of the variable resistance element according to Embodiment 2 of the present invention.

First, as illustrated in FIGS. 4A and 4B, a titanium nitride film (having a thickness of 5 to 20 nm) which serves as the adhesion layer 302, a tantalum nitride film (having a thickness of 50 to 200 nm) which serves as the first electrode 307, and a first tantalum oxide film (having a thickness of 18 to 95 nm) which serves as the first variable resistance layer 306b are formed on this order by a sputtering method. Subsequently, a stacked structure including the above-mentioned layers which later serves as the adhesion layer 302, the first electrode 307, and the first variable resistance layer 306b is patterned into a shape of a variable resistance element by etching using a desired mask. In the present process, patterning may be performed at one time using a single mask, or may be performed for each layer.

Figure 4C:
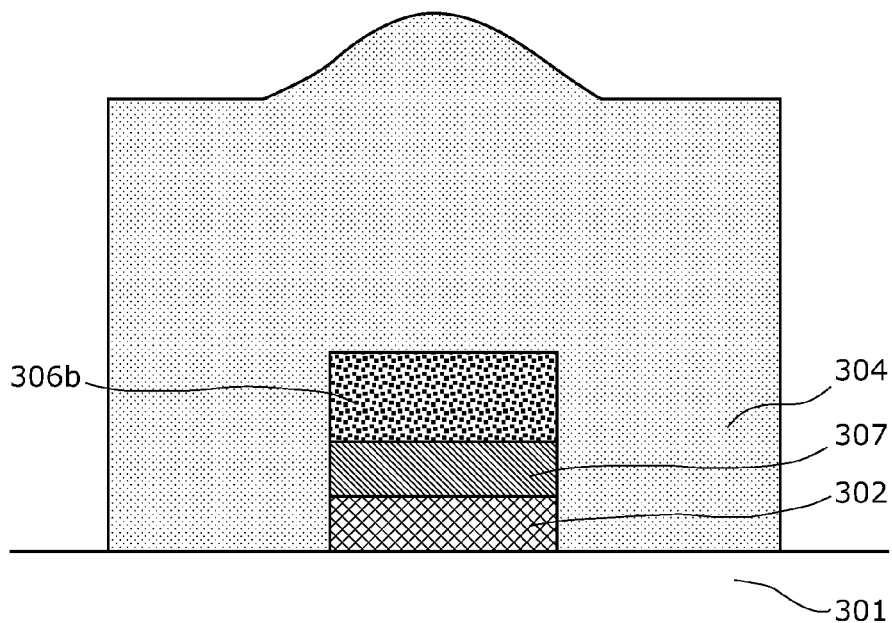
FIG. 4C is a cross-sectional view illustrating the method of manufacturing the main part of the variable resistance element according to Embodiment 2 of the present invention.
Figure 4D:
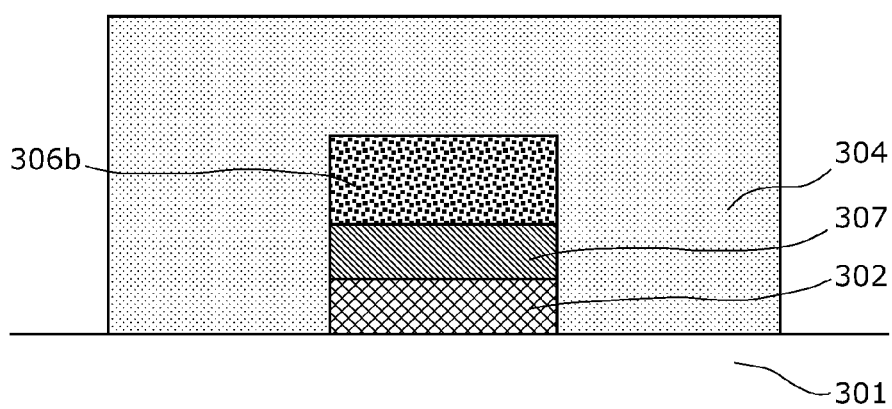
FIG. 4D is a cross-sectional view illustrating the method of manufacturing the main part of the variable resistance element according to Embodiment 2 of the present invention.

Next, as illustrated in FIGS. 4C and 4D, a silicon nitride film which serves as the interlayer insulating layer 304 is formed to cover a stacked structure including the adhesion layer 302, the first electrode 307, and the first variable resistance layer 306b, and the surface of the formed silicon nitride film is planarized.

Figure 4E:
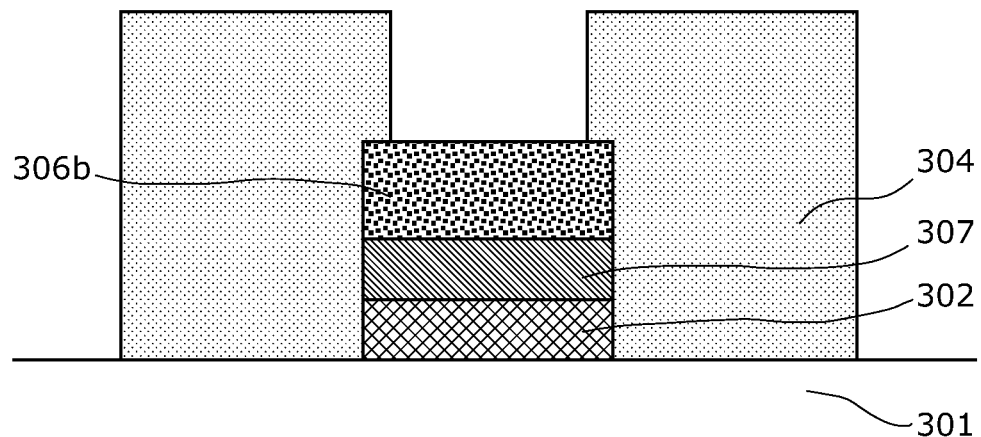
FIG. 4E is a cross-sectional view illustrating the method of manufacturing the main part of the variable resistance element according to Embodiment 2 of the present invention.

Next, as illustrated in FIG. 4E, a contact hole is formed by etching the silicon nitride film having the planarized surface using a desired mask.

Subsequently, a silicon oxide which serves as the spacer 309 is deposited using a CVD method on the first variable resistance layer 306b and interlayer insulating layer 304 in the contact hole, and the interlayer insulating layer 304 outside the contact hole.

Figure 4F:
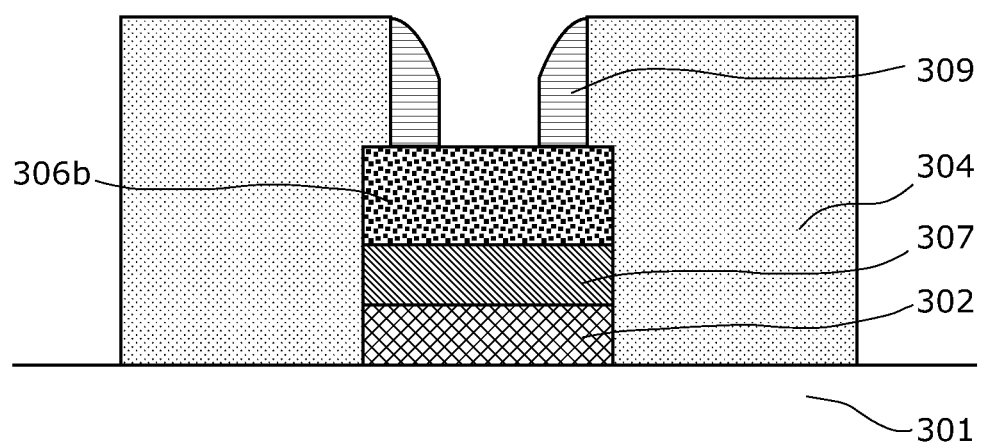
FIG. 4F is a cross-sectional view illustrating the method of manufacturing the main part of the variable resistance element according to Embodiment 2 of the present invention.

Next, as illustrated in FIG. 4F, the upper surface of the interlayer insulating layer 304 and the upper surface of the first variable resistance layer 306b in the contact hole are exposed by anisotropically etching the deposited silicon oxide. Consequently, the spacer 309 comprising an insulating material such as a silicon oxide is formed on the side wall of the interlayer insulating layer 304.

Next, as illustrated in FIG. 4G, the second tantalum oxide film which serves as the second variable resistance layer 306a is formed by sputtering so as to cover the spacer 309 and the first variable resistance layer 306b in the contact hole, and the interlayer insulating layer 304. The thickness of the second tantalum oxide film in the region where the second tantalum oxide film is in contact with the first variable resistance layer 306b is approximately in a range of 5 to 10 nm.

Next, as illustrated in FIG. 4H, an iridium film (having a thickness of 50 to 100 nm on the interlayer insulating layer 304) which serves as the second electrode 305 is formed by sputtering.

With the manufacturing method of Embodiment 2 described above, the needle-shaped part of the second electrode 305 is formed in a self-aligned manner, and thus the process of etching precious metal used as an electrode material, which is needed in the manufacturing method of Embodiment 1, can be omitted, and the manufacturing cost can be reduced. Because dry etching is not used in the formation of the second variable resistance layer 306a in the present embodiment, dry etching damage is not made in the second variable resistance layer 306a, and thus the second variable resistance layer 306a having favorable characteristics can be formed.

In the present embodiment, a cone has been mentioned as an example of the shape of the needle-shaped part of the second electrodes 105, 305, however, not only a cone but also, for example, any conic shape or a shape which is formed by sharply raising or depressing an electrode material film having a substantially uniform thickness at a single location may be used. By providing the second electrode with a single needle-shaped part, the location of the filament region can be intentionally and easily controlled, and consequently, the effect of reducing a variation in the elements can be achieved as described above.

The subject to be manufactured by the manufacturing method in the present invention is not limited to the variable resistance elements having the form illustrated in the present embodiment. That is to say, any electronic device provided with the variable resistance element can be manufactured by the above-described manufacturing method, or by a method combining the above-described manufacturing method and any generally known method.

The variable resistance element and the method of manufacturing the variable resistance element according to the present invention may be used in a next-generation nonvolatile memory which is oriented to low power, high-speed writing, high speed erasing, and large capacity applications.

REFERENCE SIGNS LIST 100, 300, 500, 800, 900, 1000 Variable resistance element
101, 301, 501, 1001 Substrate
102, 302 Adhesion layer
103 Conductive Layer
104, 304 Interlayer insulating layer
105, 305, 505, 805, 905, 1005 Second electrode
106, 306, 506, 806, 906, 1006 Variable resistance layer
106a, 306a Second variable resistance layer
106b, 306b First variable resistance layer
107, 307, 507, 807, 907, 1007 First electrode
108 Hard mask
309 Spacer
506a Second transition metal oxide layer
506b First transition metal oxide layer
806c Filament
905a Nano-needle
1002 Oxide layer
1005a Needles
1006a Second metal oxide layer
1006b First metal oxide layer

The invention claimed is:

1. A variable resistance element comprising: a first electrode; a second electrode; and a variable resistance layer interposed between the first electrode and the second electrode and in contact with the first electrode and the second electrode, the variable resistance layer having a resistance value which is reversibly changeable according to electrical signals applied between the first electrode and the second electrode, wherein the variable resistance layer includes a first variable resistance layer comprising a first oxygen-deficient transition metal oxide, and a second variable resistance layer comprising a second transition metal oxide having a degree of oxygen deficiency lower than a degree of oxygen deficiency of the first oxygen-deficient transition metal oxide, wherein the first variable resistance layer and the second variable resistance layer are stacked, wherein the second electrode has a single needle-shaped part protruding toward the second variable resistance layer, wherein the second variable resistance layer is interposed between the first variable resistance layer and the second electrode, is in contact with the first variable resistance layer and the second electrode, and covers the single needle-shaped part of the second electrode, and wherein a height, in a thickness direction, of the single needle-shaped part of the second electrode is greater than a thickness of a portion of the second variable resistance layer at a location where the single needle-shaped part does not protrude toward the second variable resistance layer.

2. The variable resistance element according to claim 1, wherein the first variable resistance layer has a recess at a location where the single needle-shaped part protrudes toward the first variable resistance layer.

3. The variable resistance element according to claim 1, wherein the second variable resistance layer has a protrusion at the location where the needle-shaped part protrudes toward the second variable resistance layer, and is connected to the first variable resistance layer only at the protrusion, and wherein the variable resistance element further comprises a spacer which is interposed between the first variable resistance layer and the second variable resistance layer, and which covers a side surface of the protrusion of the second variable resistance layer.

4. The variable resistance element according to claim 1, wherein the second electrode is stacked on a semiconductor substrate in the variable resistance element, the second variable resistance layer is stacked on the second electrode, the first variable resistance layer is stacked on the second variable resistance layer, and the first electrode is stacked on the first variable resistance layer.

5. The variable resistance element according to claim 1, wherein the first electrode is stacked on a semiconductor substrate in the variable resistance element, the first variable resistance layer is stacked on the first electrode, the second variable resistance layer is stacked on the first variable resistance layer, and the second electrode is stacked on the second variable resistance layer.

6. The variable resistance element according to claim 1, wherein each of the first oxygen-deficient transition metal oxide and the second transition metal oxide comprises one of a tantalum oxide, a hafnium oxide, a zirconium oxide, a titanium oxide, a niobium oxide, a tungsten oxide, a nickel oxide, and an iron oxide.

7. The variable resistance element according to claim 1, wherein a resistance value of the second variable resistance layer is higher than a resistance value of the first variable resistance layer.

8. The variable resistance element according to claim 1, wherein a standard electrode potential of the second variable resistance layer is lower than a standard electrode potential of the first variable resistance layer.

9. The variable resistance element according to claim 1, wherein a dielectric constant of the second variable resistance layer is higher than a dielectric constant of the first variable resistance layer.

10. The variable resistance element according to claim 1, wherein a band gap of the second variable resistance layer is smaller than a band gap of the first variable resistance layer.

11. The variable resistance element according to claim 1, wherein a standard electrode potential of the second electrode is higher than a standard electrode potential of a transition metal comprised in the second transition metal oxide, and is higher than a standard electrode potential of the first electrode.

12. The variable resistance element according to claim 1, wherein the second variable resistance layer has a first thickness at the location where the single needle-shaped part does not protrude toward the second variable resistance layer, and a second thickness at a location where the single needle-shaped part protrudes toward the second variable resistance layer, the first thickness being greater than the second thickness.

13. The variable resistance element according to claim 1, wherein the second electrode has only one single needle-shaped part protruding toward the second variable resistance layer.

14. The variable resistance element according to claim 13, wherein the only one single needle-shaped part is located at substantially a center of the variable resistance element.

15. The variable resistance element according to claim 1, wherein an interface between the first variable resistance layer and the second variable resistance layer at the location where the single needle-shaped part does not protrude toward the second variable resistance layer is further away from the first electrode than a tip of the single needle-shaped part.

* * * * *